United States Patent [19]
Morishita et al.

[11] Patent Number: 4,719,427
[45] Date of Patent: Jan. 12, 1988

[54] VEHICLE BATTERY DIAGNOSTIC DEVICE

[75] Inventors: Mitsuharu Morishita; Shinichi Kouge, both of Hyogo, Japan

[73] Assignee: Mitsubishi Denki Kabushiki Kaisha, Tokyo, Japan

[21] Appl. No.: 894,135

[22] Filed: Aug. 7, 1986

Related U.S. Application Data

[63] Continuation-in-part of Ser. No. 506,260, Jun. 20, 1983, abandoned.

[51] Int. Cl.$^4$ .................... G01N 27/46; H02J 7/04
[52] U.S. Cl. ..................... 324/427; 324/426; 324/430; 324/431; 320/48
[58] Field of Search ............ 324/430, 432, 426, 427, 324/433, 429, 431; 320/43, 48; 340/636

[56] References Cited

U.S. PATENT DOCUMENTS 4,028,616  6/1977  Stevens ........................... 324/433
4,308,492 12/1981  Mori et al. ...................... 320/43 X
4,329,406  5/1982  Dahl et al. ...................... 324/432 X
4,543,521  9/1985  Morishita et al. ................ 320/39 X
4,583,036  4/1986  Morishita et al. ................ 320/48 X Primary Examiner—Reinhard J. Eisenzopf
Assistant Examiner—Jack B. Harvey
Attorney, Agent, or Firm—Sughrue, Mion, Zinn, Macpeak & Seas

[57] ABSTRACT

A vehicular charging system is provided with a microcomputer for performing a diagnostic routine on the vehicle battery and charging system. The battery charging condition and internal resistance are monitored to determine the service life of the battery and the state of the battery charging system. The internal resistance is calculated by taking the difference between the voltage when the battery terminals are in an open circuit condition and the voltage when the battery terminals are in a closed circuit state and dividing this difference by the battery current. Also included in the charge condition measurement is the measurement of the specific gravity of the battery.

1 Claim, 1 Drawing Figure

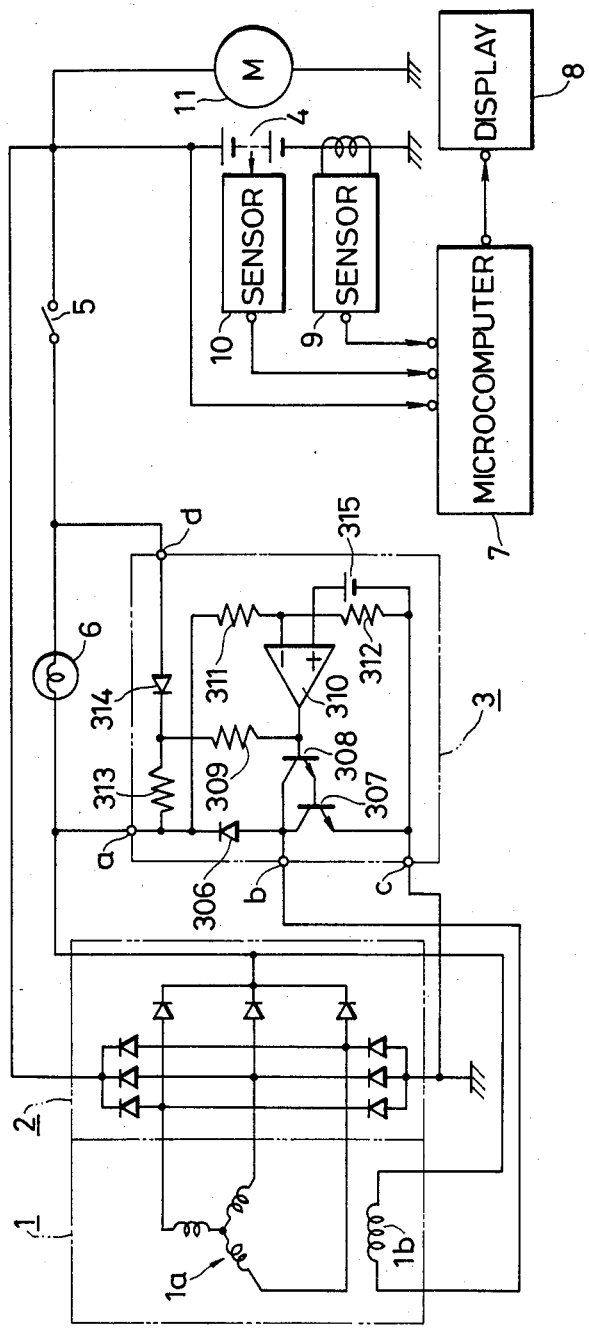

VEHICLE BATTERY DIAGNOSTIC DEVICE

RELATED U.S. APPLICATION DATA

Continuation-in-part of Ser. No. 506,260, filed June 20, 1983, abandoned.

BACKGROUND OF THE INVENTION

This invention relates to a device for diagnosing the charging state of a battery adapted to store the energy generated by a generator driven by the engine of a vehicle.

In a vehicle charging system of this type, a pilot lamp is connected between the initial excitation terminal and the voltage detection terminal of the voltage regulator, so that it may be determined from observation of the pilot whether or not the charging system operates satisfactorily. Since the battery is charged or discharged through electrochemical change as is well known in the art, the terminal voltage and the internal resistance thereof depends on the charging state. The charging function depends on the ambient temperature, the specific gravity and the acidity of electrolyte and the number of charge and discharge cycles to which the battery has been subjected. Thus, the battery has intricate variable factors, and accordingly it is impossible to determine the condition of the battery in detail merely from observation of the pilot lamp.

SUMMARY OF THE INVENTION

Accordingly, an object of this invention is to eliminate the above-described difficulties and to provide a vehicle battery diagnostic device in which various data respecting the battery are periodically detected with a predetermined period, the condition of the battery is monitored from the present values and variations with time of these data, and the internal resistance of the battery, from which the functioning of the battery can be gauged, is calculated, so that the service life of the battery may be determined and displayed.

BRIEF DESCRIPTION OF THE DRAWING

The single FIGURE in the accompanying drawing is a block diagram of a vehicle battery diagnostic device according to one embodiment of this invention.

DETAILED DESCRIPTION OF THE PREFERRED EMBODIMENT

One embodiment of this invention will now be described with reference to the single FIGURE in the accompanying drawing. The single FIGURE is a block diagram showing a vehicle battery diagnostic device according to the invention. In the FIGURE, reference numeral 1 designates a generator having an armature 1a and a field coil 1b; 2, a rectifier comprising a plurality of diodes, for rectifying the outputs of the generator 1, i.e., the three-phase AC outputs of the armature 1a; 3, a voltage regulator comprising diodes 306 and 314, transistors 307 and 308, resistors 311, 312 and 313, a comparator 210 and a reference voltage source 315, and having a voltage detecting terminal a, a terminal b connected to the field coil 1b, for permitting a controlled field current, a grounding terminal c and a terminal d for supplying a current adapted to initially excite the generator; 4, an ordinary battery; 5, a key switch which is closed to start the internal combustion engine (not shown); 6, a pilot lamp connected between the terminals a and d, the pilot lamp 6 being turned on or off according to the voltage difference between these terminals (the voltage difference being large at the time of starting the engine); and 7, a microcomputer for controlling the charging system. The microcomputer 7 comprises an analog-to-digital converter for converting analog level input signals (battery data) regarding the battery 4 into digital signals, a central processing unit for reading the output of the analog-to-digital converter at a predetermined period or sampling frequency, to perform diagnosis according to a diagnostic program.

Further in the FIGURE, reference numeral 8 designates a display unit for displaying the result of the diagnosis, which is outputted by the microcomputer or control section 7; 9, a sensor for detecting a current flowing through the negative terminal of the battery 4 and for applying this data to the control section 7; 10, a sensor for detecting the specific gravity of the electrolyte in the battery 4 and for applying this data to the microcomputer; and 11, the conventional starter of the internal combustion engine.

The operation of the device thus organized will now be described. The microcomputer 7 reads the voltage at the positive terminal of the battery 4 and the output signals of the sensors 9 and 10 at predetermined intervals, to monitor the state of the battery 4 according to a diagnostic program, to thereby diagnose the battery 4. This diagnosis includes a determination of the state of the rectifier side from the terminal voltage of the battery 4. (a) If the signal from the sensor 10 does not equal a predetermined value when the key switch 5 is turned on, it is determined that the battery 4 has been excessively discharged. (b) If the voltage of the battery 4 and the output signals of the sensors 9 and 10 equal predetermined values when the internal combustion engine is started, it is determined that the battery 4 is normal. (c) If the polarity of the signal from the sensor 9 is not changed within a sufficiently long period of time for the internal combustion engine to be started after the key switch is turned on, it is determined that the battery 4 is not charged, because the starting operation has failed, the generator 1 does not work, or the rectifier 2 is out of order. (d) If the internal combustion engine is started, the signal of the sensor 10 indicates the charging of the battery 4 and the terminal voltage of the battery 4 is detected as saturated, it is determined that the battery 4 is correctly charged. (e) If the internal resistance of the battery 4 is larger than a predetermined value, which, under the conditions that the battery 4 is being charged correctly, is calculated from the ratio of the signal of the sensor 9 to the variation of the terminal voltage of the battery, it is determined that the performance of the battery 4 has been lowered. In addition, other conditions of the battery 4 can be determined from the combinations of the present conditions of the three signals applied to the control section 7 and from the variations with time thereof. The results of the diagnosis are applied to the display unit 8, where they are displayed.

The microcomputer 7 in diagnosing the charge state of the battery 4 from combinations of the measured voltage, current and specific gravity makes simple calculations using the values from sensors 9 and 10 and the measured battery terminal voltage to determine battery internal resistance, and other calculated indicia of the charge condition of the battery. The battery internal resistance $r_B$ is calculated by dividing the difference between the open circuit and closed circuit battery terminal voltage by the battery current. The microcomputer also calculates a corrected specific gravity S from the measured specific gravity $S_t$ and the temperature t° C. of the electrolyte at the time the specific gravity was measured, according to the empirically derived equation:

$$S = S_t + 0.0007(t-20)$$

The microcomputer then calculates the amount by which the battery has discharged $I_D(Ah)$ from its rated capacity according to the equation:

$$I_D(Ah) = \text{Rated capacity of the battery } (Ah) \times \frac{S_{fc} - S_m}{S_{fc} - S_{fd}}$$

where:

$S_{fc}$ is the specific gravity when the battery is fully charged;

$S_m$ is the specific gravity when the specific gravity is measured; and $S_{fd}$ is the specific gravity when the battery is fully discharged.

The following numeric values for $S_{fc}$ and $S_{fd}$ have been determined experimentally:

$$S_{fc} = 1.26$$

$$S_{fd} = 1.06$$

Accordingly, the discharge amount, $I_D$, can be defined as follows substituting the experimental values for $S_{fc}$ and $S_{fd}$:

$$I_D(Ah) = \frac{\text{Rated capacity of the battery} \times (1.26 \, S_m)}{0.2}$$

The percent of discharge, $D_c$, is then calculated according to the equation:

$$D_c = \frac{I_D}{\text{Rated Capacity of the battery}} \times 100\%$$

It is to be understood that a fully discharged battery is represented by $D_c = 100\%$ and a fully charged battery by $D_c = 0\%$.

It should also be understood that when the battery is fully discharged its internal resistance, $r_B$, is about 1.3 times as great as it is when the battery is fully charged, while the value of the internal resistance, $r_B$, as the battery approaches the end of its life period is about twice that of a new battery.

The calculated internal resistance and percent of discharge are used by the microcomputer to provide an indication of the battery charge condition which is displayed on display 8.

In the above-described embodiment, three signals constituting battery data are loaded in the microcomputer for diagnosing the battery. Instead thereof, additional voltages, currents and temperatures of other parts may be loaded for diagnosing the battery with higher accuracy.

As is apparent from the above description, according to the invention, various battery data are loaded into a microcomputer with a predetermined frequency, so that the state of the charging system including the battery is monitored from the present values and variations with time of these data, the internal resistance of the battery is calculated and various symptoms of the battery are diagnosed and displayed. Therefore, the device of the invention is effective in the maintenance of the battery.

What is claimed is:

1. A battery diagnostic device comprising:

voltage detecting means for detecting the terminal voltage of a battery charged by a generator, and for producing a first output signal proportional to the detected terminal voltage;

current detecting means for detecting the charge and discharge currents of said battery, and for producing a second output signal, $I_1$, proportional to the detected battery current;

specific gravity detecting means for detecting the specific gravity of the battery electrolyte, and for producing a third output signal $S_t$ proportional to the detected specific gravity;

microcomputer data processing means, responsive to said first, second and third output signals, for calculating and then outputting signals indicating the battery charge condition, said microcomputer data processing means including, means for calculating the battery internal resistance $r_B$ from the difference between said first output signal when the battery terminals are in an open circuit condition, $V_1$, and said first output signal when the battery terminals are in a closed circuit state, $V_2$, and said second output signal, $I_1$, from the relationship, $$r_B = \frac{V_1 - V_2}{I_1},$$

means for calculating a temperature corrected specific gravity S from the third output signal $S_t$ and the temperature t° C. of the electrolyte at the time the specific gravity was detected from the relationship, $S = S_t + 0.0007$ (t° C. $-20$), means for calculating the amount the battery has discharged $I_D(Ah)$ from its rated capacity (Ah) from to the relationship, $$I_D(Ah) = \frac{\text{Rated capacity of the battery }(Ah) \times (1.260 - S_m)}{0.2},$$

means for calculating the percent of discharge $D_C$ from the relationship, $$D_C = \frac{I_D}{\text{Rated capacity of the battery}} \times 100\%,$$

and means for producing signals proportional to the calculated resistance $r_B$, temperature corrected specific gravity S, discharge amount $I_D$ and percent of discharge $D_C$; and means for displaying the charge condition of the battery determined from at least said signals proportional to said calculated internal resistance $r_B$ and percent of discharge $D_C$.

* * * * *